(12) United States Patent
Fujikawa

(10) Patent No.: US 12,222,614 B2
(45) Date of Patent: Feb. 11, 2025

(54) ELECTRO-OPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 337 days.

(21) Appl. No.: 17/938,941

(22) Filed: Sep. 7, 2022

(65) Prior Publication Data
US 2023/0071096 A1    Mar. 9, 2023

(30) Foreign Application Priority Data

Sep. 9, 2021 (JP) .................................. 2021-146817

(51) Int. Cl.
| | |
|---|---|
| G02F 1/1347 | (2006.01) |
| G01K 13/00 | (2021.01) |
| G02F 1/1362 | (2006.01) |
| H02H 9/04 | (2006.01) |
| G02F 1/1345 | (2006.01) |
| H05K 1/18 | (2006.01) |

(52) U.S. Cl.
CPC ....... *G02F 1/136204* (2013.01); *G01K 13/00* (2013.01); *G02F 1/136286* (2013.01); *H02H 9/046* (2013.01); *G02F 1/13452* (2013.01); *H05K 1/18* (2013.01); *H05K 2201/10015* (2013.01); *H05K 2201/10136* (2013.01); *H05K 2201/10507* (2013.01)

(58) Field of Classification Search
CPC .................................................... G02F 1/1347
See application file for complete search history.

(56) References Cited

U.S. PATENT DOCUMENTS

| | | | |
|---|---|---|---|
| 5,500,547 A | | 3/1996 | Yamaguchi et al. |
| 2012/0299804 A1* | | 11/2012 | Senda ...................... G09G 3/20 345/55 |
| 2016/0284446 A1* | | 9/2016 | Fujikawa ............... H01C 7/006 |
| 2021/0026189 A1* | | 1/2021 | Fujikawa .......... G02F 1/134309 |
| 2021/0104186 A1* | | 4/2021 | Fujikawa .......... G02F 1/136204 |

(Continued)

FOREIGN PATENT DOCUMENTS

| | | |
|---|---|---|
| JP | H07202129 | 8/1995 |
| JP | 2002208677 | 7/2002 |

(Continued)

*Primary Examiner* — Sang V Nguyen
(74) *Attorney, Agent, or Firm* — JCIPRNET

(57) ABSTRACT

In an electro-optical device, a first substrate is provided with a temperature detection element and an electro-static protection circuit that protects the temperature detection element from a surge current. A first resistor element is electrically coupled to the temperature detection element in series. The electro-static protection circuit includes a transistor electrically coupled to the first resistor element and the temperature detection element in parallel. A first capacitance element is provided on a wiring substrate electrically coupled to the first substrate, and is provided between a first coupling wiring line electrically coupled to one side of the temperature detection element and a second coupling wiring line electrically coupled to the other side thereof.

15 Claims, 8 Drawing Sheets

(56) References Cited

U.S. PATENT DOCUMENTS

2022/0283463 A1* 9/2022 Fujikawa .......... G02F 1/133382
2023/0068144 A1* 3/2023 Fujikawa ............ H01L 21/3205

FOREIGN PATENT DOCUMENTS

| | | |
|---|---|---|
| JP | 2007287919 | 11/2007 |
| JP | 2016184719 | 10/2016 |
| JP | 2021018367 | 2/2021 |

* cited by examiner

ELECTRO-OPTICAL DEVICE AND ELECTRONIC APPARATUS

The present application is based on, and claims priority from JP Application Serial Number 2021-146817, filed Sep. 9, 2021, the disclosure of which is hereby incorporated by reference herein in its entirety.

BACKGROUND

1. Technical Field

The present disclosure relates to an electro-optical device including a temperature detection element and to an electronic apparatus.

2. Related Art

A technique is conceivable in which an electro-optical device such as a liquid crystal device is provided with a temperature detection element outside a display region and a drive condition is corrected or the like based on a detection result acquired by the temperature detection element. Further, a configuration is conceivable in which an electro-static protection circuit including a transistor electrically coupled to the temperature detection element in parallel is provided so as to protect the temperature detection element from a surge current (see JP-A-2016-184719 and JP-A-2021-18367). Further, JP-A-2016-184719 and JP-A-2021-18367 describe a configuration in which a resistor is provided to an anode wiring line extending from an anode terminal to the transistor and a resistor is provided to a cathode wiring line extending from a cathode terminal to the transistor so as to reduce a surge current.

In order to highly accurately detect temperature by the temperature detection element driven with a constant current, it is required to reduce a leakage current of the transistor of the electro-static protection circuit when a temperature of the electro-optical device is increased. Here, for example, when a transistor having a Lightly Doped Drain (LDD) structure is used as a transistor of an electro-static protection circuit, which is capable of suppressing a leakage current, there is a problem that a function of protecting the temperature detection element is insufficient. This is because a discharging function is insufficient when a surge current enters.

SUMMARY

In order to solve the above-mentioned problem, an electro-optical device according to one aspect of the present disclosure includes a temperature detection element, a first resistor element electrically coupled to the temperature detection element in series, and an electro-static protection circuit including a transistor electrically coupled to the first resistor element and the temperature detection element in parallel.

The electro-optical device according to the present disclosure is used for an electronic apparatus.

DESCRIPTION OF EXEMPLARY EMBODIMENTS

Figure 1:
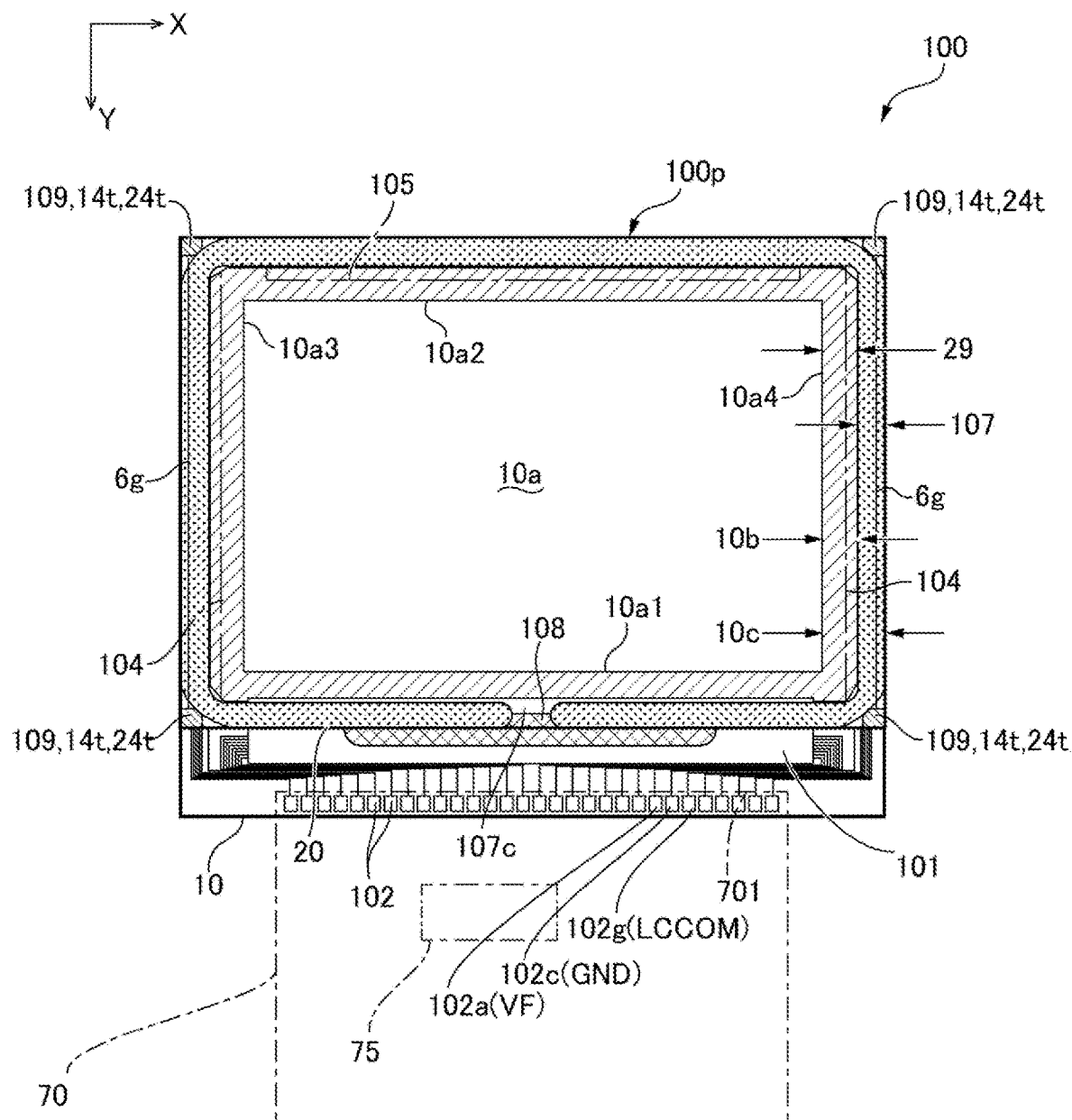
FIG. 1 is a plan view illustrating a configuration example of an electro-optical device according to a first exemplary embodiment of the present disclosure.

Exemplary embodiments of the present disclosure are now described herein with reference to the accompanying drawings. Note that, in each of the figures to be referred to in the following description, to illustrate each layer, each member, and the like in a recognizable size in the drawings, each layer, each member, and the like are illustrated at a different scale.

1. First Exemplary Embodiment

1-1. Specific Configuration of Electro-Optical Device 100

Figure 2:
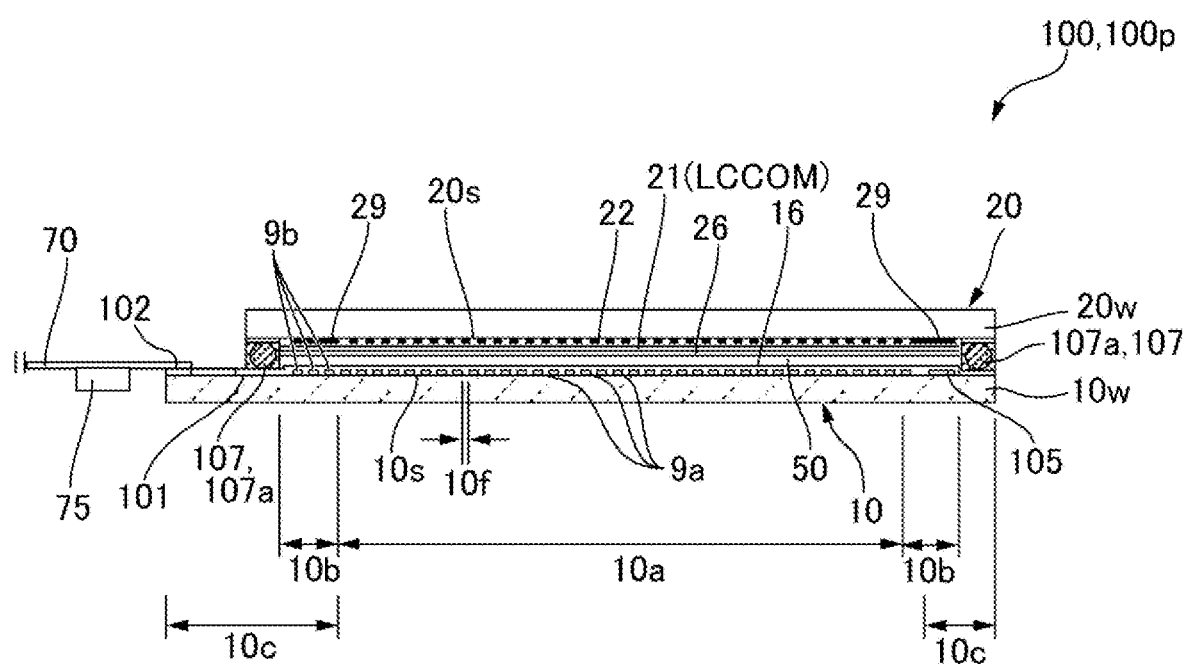
FIG. 2 is an explanatory diagram schematically illustrating a cross-section of the electro-optical device illustrated in FIG. 1.

FIG. 1 is a plan view illustrating a configuration example of an electro-optical device 100 according to a first exemplary embodiment of the present disclosure. FIG. 2 is an explanatory diagram schematically illustrating a cross-section of the electro-optical device 100 illustrated in FIG. 1. The electro-optical device 100 illustrated in FIG. 1 and FIG. 2 is a liquid crystal device, and the electro-optical device 100 includes an electro-optical panel 100p including a liquid crystal panel. In the electro-optical device 100, a first substrate 10 and a second substrate 20 are bonded together by a seal material 107 via a predetermined gap between the first substrate 10 and the second substrate 20, and the seal material 107 is provided in a frame shape along an outer periphery of the second substrate 20. The seal material 107 is an adhesive including a photocurable resin, a thermosetting resin and the like, and the seal material 107 includes a gap material 107a such as glass fiber or glass beads compounded to set a distance between the first substrate 10 and the second substrate 20 to a predetermined value. In the electro-optical device 100, an electro-optical layer 50 including a liquid crystal layer is provided inside a region surrounded by the seal material 107, of a space between the first substrate 10 and the second substrate 20. In the seal material 107, a cut portion 107c used as a liquid crystal injection port is formed, and such a cut portion 107c is sealed by a sealing material 108 after a liquid crystal material is injected. Note that in a case in which the liquid crystal material is injected and sealed by using a dropping method, the cut portion 107c is not formed. Each of the first substrate 10 and the second substrate 20 has a quadrangular shape. In a substantially central portion of the electro-optical device 100, a display region 10a is provided as a quadrangular region. In accordance with such a shape, the seal material 107 is also provided in a substantially quadrangular shape, and an outer peripheral region 10c having a quadrangular frame shape is provided outside the display region 10a.

It is assumed that the display region 10a has two sides extending in an X direction, which are a first side 10a1 and a second side 10a2, and two sides extending in a Y direction, which are a third side 10a3 and a fourth side 10a4. In this case, in the outer peripheral region 10c of the first substrate 10, a data line drive circuit 101 is provided between the end of the first substrate 10 and the first side 10a1 of the display region 10a, and a detection circuit 105 is provided between the end of the first substrate 10 and the second side 10a2 of the display region 10a. Scanning line drive circuits 104 are provided between the end of the first substrate 10 and the third side 10a3 of the display region 10a and between the end of the first substrate 10 and the fourth side 10a4 of the display region 10a. Terminals 102 for mounting are arrayed at the end on the side close to the data line drive circuit 101, of the ends of the first substrate 10. A wiring substrate 70 is electrically coupled to the terminals 102. The wiring substrate 70 is electrically coupled to an upper circuit 60 via a connector 61.

The first substrate 10 includes a light-transmissive substrate main body 10w, such as a quartz substrate or a glass substrate. On a side of a first surface 10s of the first substrate 10, which faces the second substrate 20, a plurality of pixel transistors and pixel electrodes 9a are formed in a matrix pattern in the display region 10a. The pixel electrodes 9a are electrically coupled to the plurality of pixel transistors, respectively. A first oriented film 16 is formed on the upper layer side of the pixel electrodes 9a. On the side of the first surface 10s of the first substrate 10, dummy pixel electrodes 9b are formed at a part extending along each side of the display region 10a, the part being present in a quadrangular frame-shaped region 10b extending between the display region 10a and the seal material 107. The dummy pixel electrodes 9b are simultaneously formed with the pixel electrodes 9a.

The second substrate 20 includes a light-transmissive substrate main body 20w, such as a quartz substrate or a glass substrate. On a side of a first surface 20s of the second substrate 20, a common electrode 21 is formed. The common electrode 21 is formed substantially entirely at the first surface 20s of the second substrate 20. On the side of the first surface 20s of the second substrate 20, in the frame-shaped region 10b, a light shielding partition 29 is formed on the bottom layer side of the common electrode 21, and a second oriented film 26 is laminated on a surface of the common electrode 21. The display region 10a is defined by an inner periphery of the partition 29. A light-transmissive planar film 22 is formed between the partition 29 and the common electrode 21. The light shielding layer forming the partition 29 may be formed as a black matrix portion overlapping with an inter-pixel region 10f sandwiched between adjacent pixel electrodes 9a. The partition 29 is formed at a position of overlapping with the dummy pixel electrodes 9b in a planar manner. The partition 29 is formed by a light-shielding metal film or a black resin.

For example, the first oriented film 16 and the second oriented film 26 are each an inorganic alignment film including a diagonally vapor-deposited film of $SiO_x$ ($x \leq 2$), $TiO_2$, $MgO$, $Al_2O_3$ and the like, and each includes a columnar structure layer, in which columnar bodies, referred to as columns, is formed obliquely with respect to the first substrate 10 and the second substrate 20. Thus, the first oriented film 16 and the second oriented film 26 cause nematic liquid crystal molecules, which have negative dielectric anisotropy used in the electro-optical layer 50, to be oriented in an obliquely inclined manner with respect to the first substrate 10 and the second substrate 20, thereby causing the liquid crystal molecules to be pre-tilted. In this way, the electro-optical device 100 is configured as a liquid crystal device of a normally black Vertical Alignment (VA) mode.

On the outer side of the seal material 107 at the first substrate 10, inter-substrate conduction electrode portions 14t are formed at positions of overlapping with four corner portions 24t of the second substrate 20. The inter-substrate conduction electrode portions 14t are conductively coupled to wiring lines 6g, and the wiring lines 6g are conductively coupled to a terminal 102g of the terminals 102, which is for supplying a common potential LCCOM. Inter-substrate conduction materials 109 including conductive particles are arranged between the inter-substrate conduction electrode portions 14t and the corner portions 24t, and the common electrode 21 of the second substrate 20 is electrically coupled to the side of the first substrate 10 via the inter-substrate conduction electrode portions 14t and the inter-substrate conduction materials 109. Thus, the common potential LCCOM is applied to the common electrode 21 from the side of the first substrate 10.

The plurality of terminals 102 includes a first terminal 102a and a second terminal 102c that are electrically coupled to a first wiring line La and a second wiring line Lc of a temperature detection circuit 1, which is described later with reference to FIG. 3, in addition to the terminal 102g.

The electro-optical device 100 according to the present exemplary embodiment is a transmission-type liquid crystal device. Thus, the pixel electrodes 9a and the common electrode 21 are each formed of a light-transmissive conductive film, such as an Indium Tin Oxide (ITO) film and an Indium Zinc Oxide (IZO) film. In such a transmission-type liquid crystal device, for example, light source light entering from the side of the second substrate 20 is modulated before being emitted from the first substrate 10, thereby displaying an image. Note that the electro-optical device 100 may be a reflection-type liquid crystal device when the pixel electrodes 9a are formed of reflective metal such as aluminum.

1-2. Electrical Configuration of Electro-Optical Device 100

Figure 3:
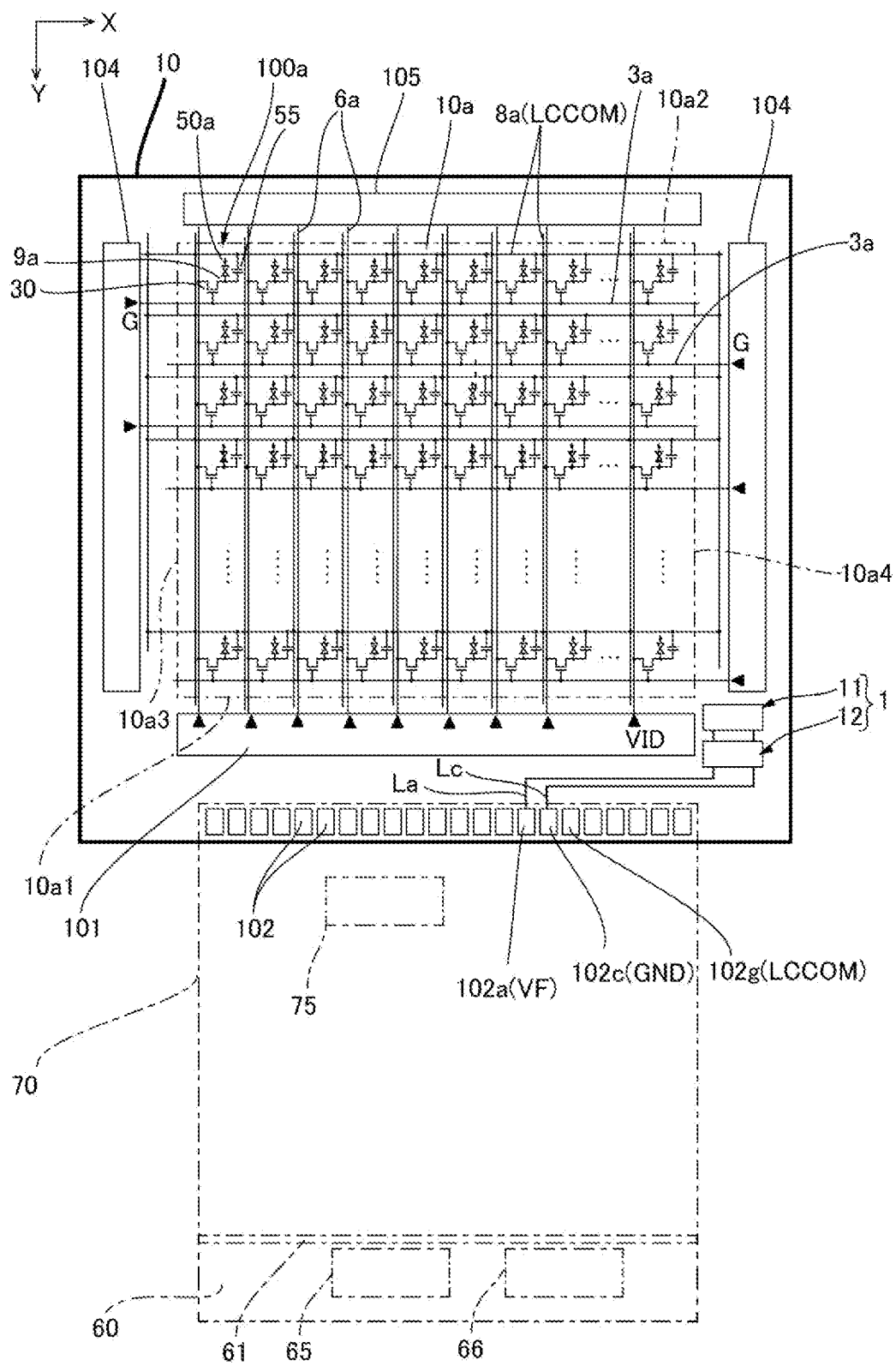
FIG. 3 is a circuit block diagram illustrating an electrical configuration of a first substrate illustrated in FIG. 2.

FIG. 3 is a circuit block diagram illustrating an electrical configuration of the first substrate 10 illustrated in FIG. 2. In FIG. 3, the first substrate 10 includes the display region 10a. In the substantially center region of the display region 10a, a plurality of pixels 100a are arrayed in a matrix pattern. A plurality of scanning lines 3a extending from the scanning line drive circuit 104 in the X direction and a plurality of data lines 6a extending from the data line drive circuit 101 in the Y direction are provided on the inner side of the display region 10a of the first substrate 10. The pixels 100a are formed in correspondence with intersections between the scanning lines 3a and the data lines 6a. The plurality of data lines 6a are electrically coupled to the detection circuit 105 on the opposite side from the data line drive circuit 101 of the display region 10a in the Y direction. In other words, the plurality of data lines 6a are electrically coupled to the detection circuit 105 provided on the side of the second side 10a2. A pixel transistor 30 formed of a field effect transistor and the pixel electrode 9a that is electrically coupled to the pixel transistor 30 are formed in each of the plurality of pixels 100a. In the present exemplary embodiment, the pixel transistor 30 is formed of an N-channel type thin film transistor having an LDD structure. The data line 6a is electrically coupled to a source of the pixel transistor 30, the scanning line 3a is electrically coupled to a gate of the pixel transistor 30, and the pixel electrode 9a is electrically coupled to a drain of the pixel transistor 30. The data line drive circuit 101 supplies an image signal VID to the data line 6a, and the scanning line drive circuit 104 supplies a scanning signal G to the scanning line 3a. The detection circuit 105 is a transistor array. One source-drain of the transistor is electrically coupled to the data line 6a, the other source-drain thereof is electrically coupled to an inspection line (not illustrated), and a gate thereof is electrically coupled to a control signal line (not illustrated) in the detection circuit 105. FIG. 3 illustrates a configuration in which the scanning line drive circuit 104 arranged on the left side of the display region 10a drives the scanning lines 3a in the odd-numbered rows and the scanning line drive circuit 104 arranged on the right side of the display region 10a drives the scanning lines 3a in the even-numbered rows, however, there may be adopted a configuration in which the scanning line drive circuits 104 arranged on both the right and left sides drive the same scanning lines 3a.

In each of the pixels 100a, the pixel electrode 9a faces the common electrode 21 of the second substrate 20, which is described above with reference to FIG. 2, via the electro-optical layer 50, and forms a liquid crystal capacitor 50a. A retention capacitor 55 arranged in parallel with the liquid crystal capacitor 50a is added to each pixel 100a so as to prevent fluctuations of the image signal VID held by the liquid crystal capacitor 50a. In the present exemplary embodiment, common potential wiring lines 8a extending across the plurality of pixels 100a are formed as capacitance lines in the first substrate 10 so as to form the retention capacitor 55, and common potential LCCOM is supplied to the common potential wiring line 8a. Each common potential wiring line 8a is provided so as to overlap with at least one of the scanning line 3a and the data line 6a in plan view. As an example, FIG. 3 illustrates a mode in which the common potential wiring line 8a overlaps with both the scanning line 3a and the data line 6a in plan view. The common potential wiring line 8a may be configured so as to overlap with, of the scanning line 3a and the data line 6a, the data line 6a in plan view. Note that, although omitted in illustration, the common potential wiring lines 8a are electrically coupled to the wiring lines 6g to which the common potential LCCOM is supplied.

When the electro-optical device 100 is mounted to an electronic apparatus, the terminals 102 are electrically coupled to the upper circuit 60 via the wiring substrate 70. The upper circuit 60 is provided with an image control circuit 65. The upper circuit 60 is provided with a temperature detection drive circuit 66 that drives the temperature detection circuit 1 described below. The upper circuit 60 is provided to a host device with respect to the electro-optical device 100 in the electronic apparatus described later.

1-3. Configurations of Temperature Detection Circuit 1 and the Like

Figure 4:
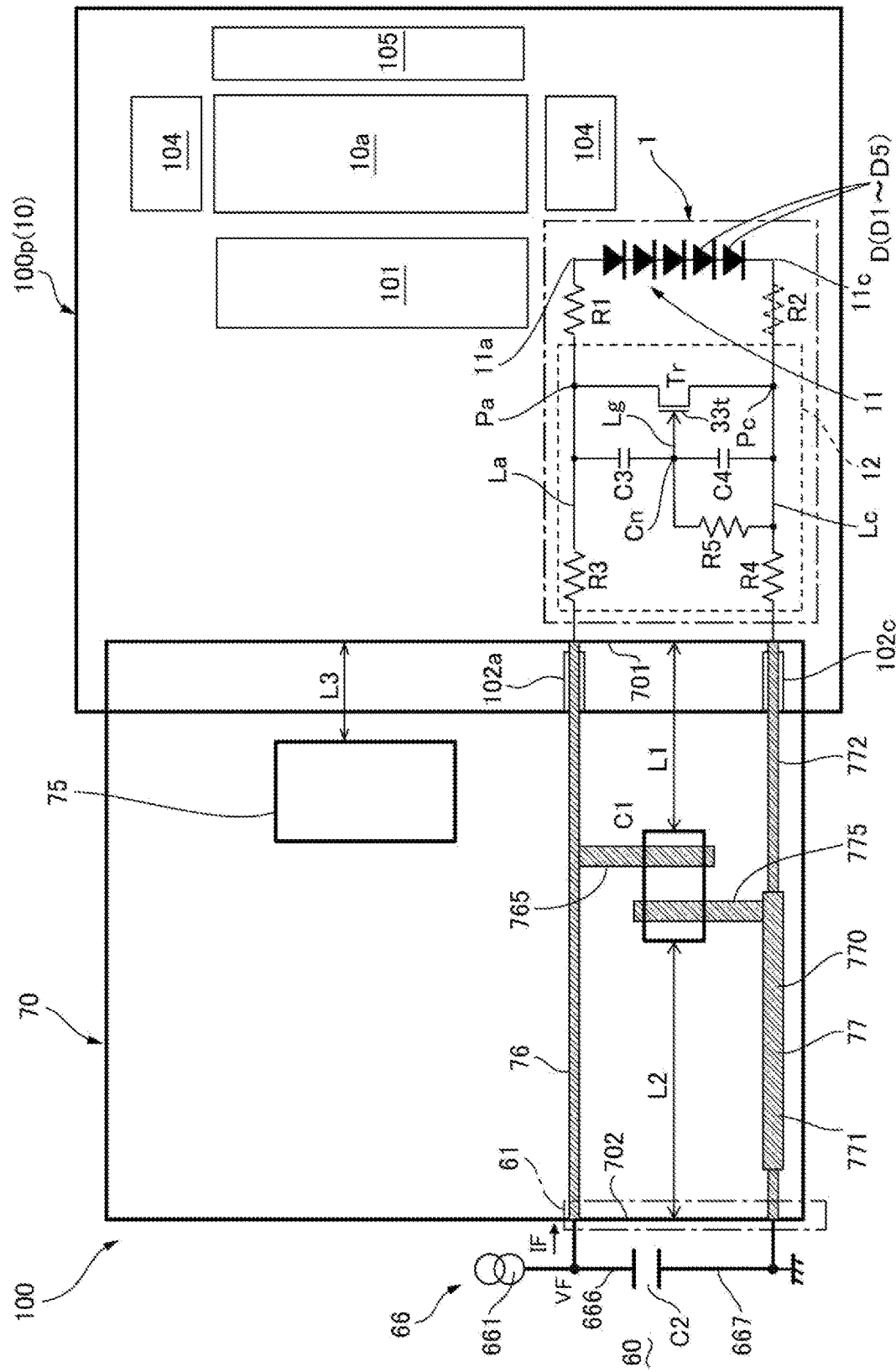
FIG. 4 is an explanatory diagram of a temperature detection circuit and the like illustrated in FIG. 3.
Figure 5:
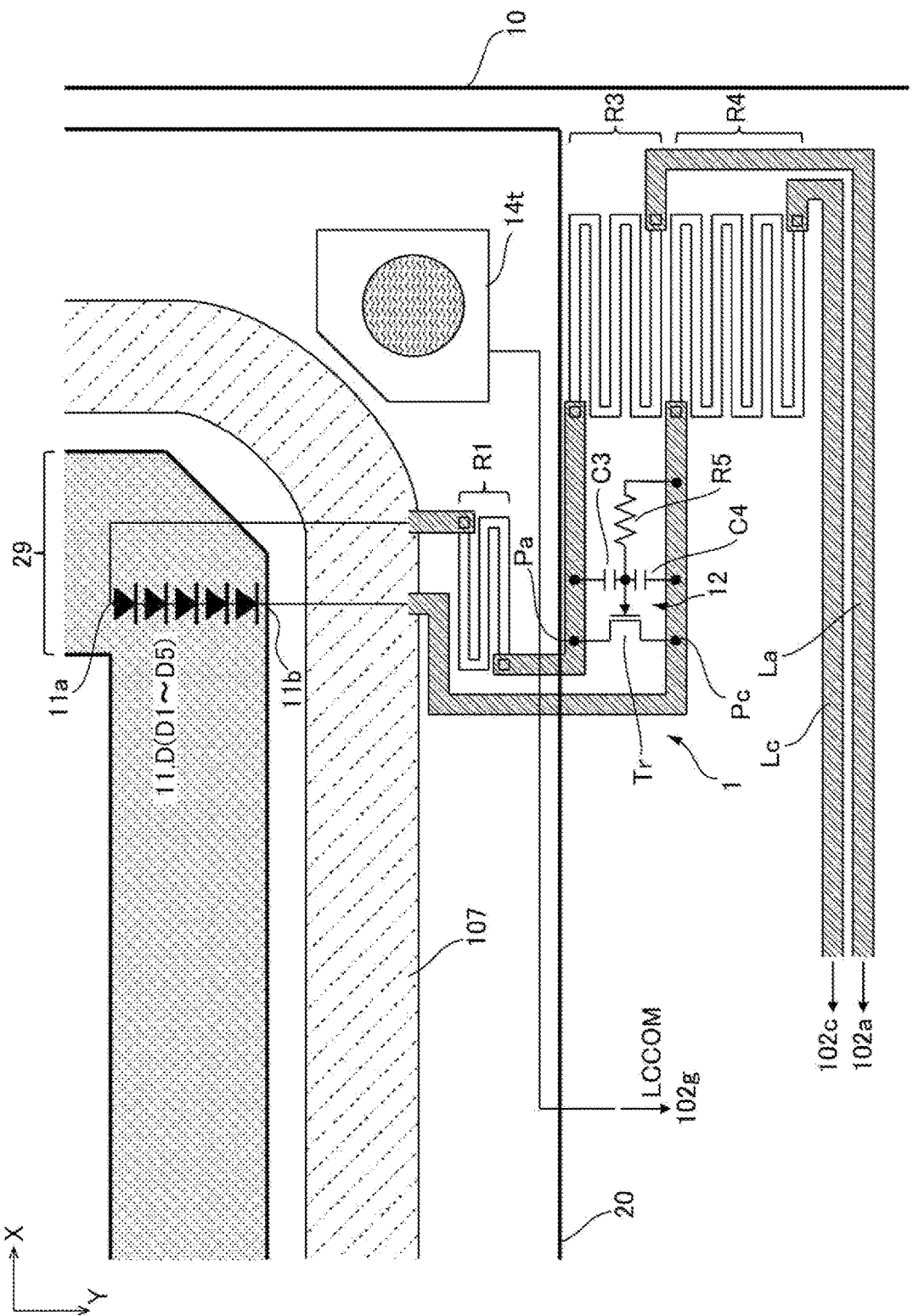
FIG. 5 is an explanatory diagram illustrating a planar configuration in the vicinity of the temperature detection circuit illustrated in FIG. 4.

FIG. 4 is an explanatory diagram of the temperature detection circuit 1 and the like illustrated in FIG. 3. FIG. 5 is an explanatory diagram illustrating a planar configuration in the vicinity of the temperature detection circuit 1 illustrated in FIG. 4. Note that FIG. 4 illustrates the temperature detection circuit 1, emphasizing on characteristics thereof as viewed in a manner of an equivalent circuit. FIG. 5 illustrates the temperature detection circuit 1, emphasizing on planar arrangement characteristics of the respective elements as viewed in a manner of an equivalent circuit.

As illustrated in FIG. 3, FIG. 4, and FIG. 5, the temperature detection circuit 1 that detects a temperature of the electro-optical panel 100p is provided on the outer side of the display region 10a of the first substrate 10. The temperature detection circuit 1 includes a temperature detection element 11 for detecting a temperature and an electro-static protection circuit 12. The electro-static protection circuit 12 includes a transistor Tr electrically coupled to the temperature detection element 11 in parallel. The electro-static protection circuit 12 protects the temperature detection element 11 from a surge current. The temperature detection element 11 is arranged in the vicinity of the display region 10a of the first substrate 10, and overlaps with the partition 29 of the second substrate 20 in plan view. The electro-static protection circuit 12 is provided between the temperature detection element 11 and the end of the first substrate 10 at which the terminals 102 are arrayed.

Similarly to the pixel transistor 30, the transistor Tr is an N-channel type thin film transistor having an LDD structure, and includes a semiconductor layer containing polysilicon as an active layer. The channel width of the transistor Tr is, for example, 800 µm, and the channel length of the transistor Tr is, for example, 5 µm.

For example, the temperature detection element 11 includes a plurality of diodes D that are electrically coupled in series. As one example, FIG. 4 and FIG. 5 illustrate a mode in which five diodes D1 to D5 are electrically coupled in series. With the temperature detection element 11 as described above, sensitivity to a temperature of a forward voltage can be set to approximately −10 mV/degree Celsius. The first wiring line La extending from the first terminal 102a is electrically coupled to an anode 11a of the temperature detection element 11. The second wiring line Lc extending from the second terminal 102c is electrically coupled to a cathode 11c of the temperature detection element 11. Therefore, in the present mode, the first wiring line La is an anode wiring line, and the second wiring line Lc is a cathode wiring line. A ground potential GND is supplied to the second wiring line Lc.

In the temperature detection circuit 1 of the present exemplary embodiment, a first resistor element R1 is electrically coupled the side of the anode 11a of the temperature detection element 11 in series. Therefore, the transistor Tr is electrically coupled to the temperature detection element 11 and the first resistor element R1 in parallel. For example, the resistance value of the first resistor element R1 is 3 kΩ.

As indicated with the broken line, a second resistor element R2 may be electrically coupled to an electrode of the temperature detection element 11, which is on an opposite side from the electrode electrically coupled to the first resistor element R1, in series. In other words, the second resistor element R2 may be electrically coupled to the side of the cathode 11c of the temperature detection element 11, in series. In this case, the transistor Tr is electrically coupled to the temperature detection element 11, the first resistor element R1, and the second resistor element R2 in parallel. For example, similarly to the first resistor element R1, the resistance value of the second resistor element R2 is 3 kΩ.

One source-drain of the transistor Tr is electrically coupled to the first wiring line La between the first terminal 102a and the anode 11a of the temperature detection element 11. In the present exemplary embodiment, the first resistor element R1 is electrically coupled the side of the anode 11a of the temperature detection element 11, in series. Thus, the one source-drain of the transistor Tr is electrically coupled to the first wiring line La between the first terminal 102a and the first resistor element R1. Therefore, the first wiring line La electrically couples the transistor Tr and the first resistor element R1 to the first terminal 102a via a coupling point Pa between the transistor Tr and the first resistor element R1. Here, the electro-static protection circuit 12 includes a third resistor element R3 between the first terminal 102a and the coupling point Pa on the first wiring line La. For example, the resistance value of the third resistor element R3 is 10 kΩ. The resistance value of the third resistor element R3 is greater than the resistance value of the first resistor element R1.

The other source-drain of the transistor Tr is electrically coupled to the second wiring line Lc between the second terminal 102c and the cathode 11c of the temperature detection element 11. Here, when the second resistor element R2 is electrically coupled to the side of the cathode 11c of the temperature detection element 11 in series, the other source-drain of the transistor Tr is electrically coupled to the second wiring line Lc between the second terminal 102c and the second resistor element R2. Therefore, the transistor Tr and the second resistor element R2 are electrically coupled to the second terminal 102c via a coupling point Pc between the transistor Tr and the second resistor element R2. Here, the electro-static protection circuit 12 includes a fourth resistor element R4 between the second terminal 102c and the coupling point Pc in the second wiring line Lc. For example, the resistance value of the fourth resistor element R4 is 15 kΩ. The resistance value of the fourth resistor element R4 is greater than the resistance value of the second resistor element R2. The resistance value of the fourth resistor element R4 is greater than the resistance value of the third resistor element R3.

The wiring substrate 70 includes a first end 701, which is electrically coupled to the terminals 102 including the first terminal 102a and the second terminal 102c, and a second end 702 on an opposite side from the first end 701, and the second end 702 is electrically coupled to the upper circuit 60 via the connector 61. The wiring substrate 70 is provided with a drive circuit element 75 that supplies image data or the like to the electro-optical panel 100p. The drive circuit element 75 is a driving IC, for example. The upper circuit 60 is provided with the image control circuit 65 that outputs image data to the drive circuit element 75.

The upper circuit 60 is provided with the temperature detection drive circuit 66 that drives the temperature detection circuit 1. Therefore, the wiring substrate 70 includes a first coupling wiring line 76, which is electrically coupled to the first wiring line La via the first terminal 102a, and a second coupling wiring line 77, which is electrically coupled to the second wiring line Lc via the second terminal 102c, and the first coupling wiring line 76 and the second coupling wiring line 77 are electrically coupled to the temperature detection drive circuit 66. The first coupling wiring line 76 and the second coupling wiring line 77 are formed of copper foils or the like provided to the wiring substrate 70.

In the present exemplary embodiment, the wiring substrate 70 is provided with a first capacitance element C1. On the wiring substrate 70, the first capacitance element C1 has one electrode electrically coupled to the first coupling wiring line 76 and the other electrode electrically coupled to the second coupling wiring line 77. More specifically, the wiring substrate 70 includes a first electrode portion 765, which protrudes from the mid position in the first coupling wiring line 76 toward the second coupling wiring line 77, and a second electrode portion 775, which protrudes from the mid position in the second coupling wiring line 77 toward the first coupling wiring line 76, and the first capacitance element C1 of a chip type is mounted to the first electrode portion 765 and the second electrode portion 775. An electro-static capacitance of the first capacitance element C1 is 0.22 μF, for example. Note that when the first capacitance element C1 is a chip type, the long-side direction of the first capacitance element C1 may match with the extension direction of the wiring substrate 70. With this configuration, the dimension of the wiring substrate 70 in the width direction orthogonal to the extension direction of the wiring substrate 70 can be reduced. Note that the first electrode portion 765 and the second electrode portion 775 that protrude are provided, but the present mode is not limited thereto. For example, there may be adopted a mode in which, on the wiring substrate 70, the first coupling wiring line 76 and the second coupling wiring line 77 are bent in the width direction of the wiring substrate 70 while maintaining the parallel state, and the first capacitance element C1 is mounted to the copper foil of the first coupling wiring line 76 itself and the copper foil of the second coupling wiring line 77 itself.

Note that the first capacitance element C1 may be provided between the first wiring line La and the second wiring line Lc in the first substrate 10. However, in any one of the cases in which the first capacitance element C1 is provided to the wiring substrate 70 and the first capacitance element C1 is provided to the first substrate 10, the first capacitance element C1 has one electrode electrically coupled to the first wiring line La and the other electrode electrically coupled to the second wiring line Lc. Note that the first capacitance element C1 may be embedded in a driving IC forming the drive circuit element 75.

As in the present exemplary embodiment, when the first capacitance element C1 is provided to the wiring substrate 70, a distance L1 from the first capacitance element C1 to the first end 701 is shorter than a distance L2 from the first capacitance element C1 to the second end 702. On the wiring substrate 70, a distance L3 from the drive circuit element 75 to the first end 701 is shorter than the distance L1 from the first capacitance element C1 to the first end 701.

The first coupling wiring line 76 or the second coupling wiring line 77 includes a first extending portion extending from the first capacitance element C1 to the second end 702 and a second extending portion extending from the first capacitance element C1 to the first end 701, and the first extending portion has a wider part than the second extending portion. In the present exemplary embodiment, the second coupling wiring line 77 includes a first extending portion 771 extending from the first capacitance element C1 to the second end 702 and a second extending portion 772 extending from the first capacitance element C1 to the first end 701, and the first extending portion 771 has a wide part 770 wider than the second extending portion 772.

Note that, in the electro-static protection circuit 12, a third capacitance element C3 and a fourth capacitance element C4 that are electrically coupled in series are electrically coupled to each other between the first wiring line La and the second wiring line Lc. More specifically, one electrode of the third capacitance element C3 is electrically coupled to the first wiring line La, one electrode of the fourth capacitance element C4 is electrically coupled to the second wiring line Lc, the other electrode of the third capacitance element C3 and the other electrode of the fourth capacitance element C4 are electrically coupled to each other. The one electrode of the third capacitance element C3 is electrically coupled to the first wiring line La between the first terminal 102a and the one source-drain region of the transistor Tr, and the one electrode of the fourth capacitance element C4 is electrically coupled to the second wiring line Lc between the second terminal 102c and the other source-drain region of the transistor Tr. For example, electro-static capacitances of the third capacitance element C3 and the fourth capacitance element C4 are 5 µF.

A coupling node Cn between the third capacitance element C3 and the fourth capacitance element C4 is electrically coupled to a gate of the transistor Tr. The electro-static protection circuit 12 includes a fifth resistor element R5 that is electrically coupled to the third capacitance element C3 in parallel. More specifically, a gate wiring ling Lg extending from a gate 33t of the transistor Tr is electrically coupled to the coupling node Cn between the third capacitance element C3 and the fourth capacitance element C4, and further electrically coupled to the second wiring line Lc via the fifth resistor element R5. For example, the resistance value of the fifth resistor element R5 is 500 kΩ.

In the electro-optical device 100 thus configured, the diodes D and the like forming the temperature detection element 11 are formed through use of the step of forming the elements forming the pixels 100a at the first substrate 10. For example, through use of the step of forming the pixel transistor 30 and a driving circuit transistor of the scanning line drive circuit 104, the diodes D may be formed. After the semiconductor layer of the pixel transistor 30 is formed, the first resistor element R1, the second resistor element R2, the third resistor element R3, the fourth resistor element R4, and the fifth resistor element R5 may be formed through use of the step of introducing impurities into the semiconductor layer. Through use of the step of forming a metal layer, a metal compound layer, or a polysilicon layer that forms the gate electrode of the pixel transistor 30, the scanning line 3a, and the like, the first resistor element R1, the second resistor element R2, the third resistor element R3, the fourth resistor element R4, and the fifth resistor element R5 may be formed. Through use of the step of forming the retention capacitor 55, the third capacitance element C3 and the fourth capacitance element C4 may be formed.

When the electro-optical device 100 thus configured is mounted to an electronic apparatus, the second end 702 of the wiring substrate 70 is electrically coupled to the upper circuit 60 via the connector 61. In the upper circuit 60, the temperature detection drive circuit 66 supplies a driving current IF being a constant current to the temperature detection element 11 via the first coupling wiring line 76 and the second coupling wiring line 77, and also detects a voltage of the first coupling wiring line 76 and the second coupling wiring line 77 at the time of supplying the driving current IF, as an output voltage VF of the temperature detection circuit 1. The temperature detection drive circuit 66 includes a second capacitance element C2 as a stabilizing capacitor between a wiring line 666 being an output side of the driving current IF of a constant current circuit 661 and a wiring line 667 electrically coupled to the ground potential GND. The wiring line 666 is electrically coupled to the first coupling wiring line 76 via the connector 61, and the wiring line 667 is electrically coupled to the second coupling wiring line 77 via the connector 61. The second capacitance element C2 stabilizes a measurement value of the voltage VF in the upper circuit 60. An electro-static capacitance of the second capacitance element C2 is 0.1 µF, for example. the electro-static capacitance of the second capacitance element C2 is smaller than the electro-static capacitance of the first capacitance element C1.

Here, when a constant current is suppled, a forward voltage of the temperature detection element 11 including the diodes D and a temperature establish a satisfactory linear relationship. Therefore, the temperature detection drive circuit 66 supplies, to the temperature detection circuit 1, the forward driving current IF having a minute value of approximately 100 nA to a several µA, and detects the output voltage VF between the first terminal 102a and the second terminal 102c at this state. With this, the upper circuit 60 is capable of detecting a temperature of the display region 10a of the electro-optical panel 100p. More specifically, the output voltage VF changes with respect to a temperature in accordance with satisfactory linearity within a specified temperature range at the time of using the electro-optical device 100 as a light valve or the like of a projection-type display apparatus described later. Thus, when calibration is performed in advance, a temperature of the electro-optical panel 100p can be detected. At this state, the temperature detection element 11 is arranged in the vicinity of the display region 10a, and hence a temperature of the display region 10a can be detected as appropriate. Thus, when temperature control of the electro-optical panel 100p, correction of the image signal VID, or the like is performed based on the output voltage VF of the temperature detection circuit 1, the electro-optical device 100 can be driven under an appropriate condition suitable for a temperature of the display region 10a. Thus, an image with high quality can be displayed.

Note that the gate 33t of the transistor Tr is electrically coupled to the second wiring line Lc via the fifth resistor element R5. Therefore, in a static state, the gate 33t and the second wiring line Lc have the same potential. Thus, the transistor Tr is in an off state, and a current does not flow between the source and the drain in an ideal sense. Therefore, when the temperature detection element 11 detects a temperature, a constant current supplied to the first wiring line La does not flow to the transistor Tr, and flows to the temperature detection element 11.

The electro-static protection circuit 12 protects the temperature detection element 11 from static electricity. More specifically, in the electro-static protection circuit 12, the gate-source voltage of the transistor Tr is 0 V in a static state, and the transistor Tr is in an off state. Here, when a surge current caused by static electricity enters from the first terminal 102a, the potential of the gate 33t of the transistor Tr, which is the potential of the coupling node Cn between the third capacitance element C3 and the fourth capacitance element C4, is increased while the third resistor element R3 suppresses voltage fluctuations. Thus, the transistor Tr is in an on state, and hence a surge current flows to the second terminal 102c via the transistor Tr and the second wiring line Lc. At this state, the third resistor element R3 reduces a surge current entering from the first terminal 102a, and the fourth resistor element R4 reduces a surge current entering from the second terminal 102c. A period during which the transistor Tr is in an on state is determined by the gate capacitances or the like of the third capacitance element C3, the fourth capacitance element C4, the fifth resistor element R5, and the transistor Tr. After discharging, the fifth resistor element R5 restores the gate-source voltage of the transistor Tr to 0 V. Thus, a surge current flowing to the temperature detection element 11 is suppressed by the electro-static protection circuit 12. Thus, the temperature detection element 11 can be protected.

In the present exemplary embodiment, on the wiring substrate 70 coupled to the first substrate 10, the first capacitance element C1 is electrically coupled between the first coupling wiring line 76 electrically coupled to the first wiring line La of the first substrate 10 and the second coupling wiring line 77 electrically coupled to the second wiring line Lc. Thus, for example, in a case in which only the electro-optical device 100 is used, when a surge current caused by static electricity enters the first coupling wiring line 76 from the second end 702, the temperature detection circuit 1 is effectively protected. Specifically, the first capacitance element C1 having a large capacitance value accumulates entering charges, and hence an excessive voltage is prevented from being applied to the temperature detection circuit 1.

Next, with reference to FIG. 5, planar arrangement characteristics of the respective elements in the temperature detection circuit 1 of the first substrate 10 are described. As illustrated in FIG. 5, for example, the first wiring line La electrically coupled to the first terminal 102a (not illustrated) includes the first resistor element R1 and the third resistor element R3 that are formed in a bent shape. For example, the first wiring line La includes a wiring line containing aluminum and a wiring line containing polysilicon or the like having a large sheet resistance value similarly to the first resistor element R1 and the third resistor element R3. For example, each of the first resistor element R1 and the third resistor element R3 is formed of the same material at the same layer as the scanning line 3a. The first wiring line La includes a wiring line containing aluminum between the first terminal 102a and the third resistor element R3, between the third resistor element R3 and the first resistor element R1, and between the third resistor element R3 and the temperature detection element 11. The first wiring line La is electrically coupled to the third capacitance element C3 and the one source-drain of the transistor Tr, which are described with reference to FIG. 4. The first wiring line La extends across the seal material 107 between the first resistor element R1 and the temperature detection element 11, and is electrically coupled to the anode 11a of the temperature detection element 11 arranged in a region overlapping with the partition 29.

The second wiring line Lc electrically coupled to the second terminal 102c (not illustrated) includes the fourth resistor element R4 formed in a bent shape, for example. For example, the second wiring line Lc includes a wiring line containing aluminum and a wiring line containing polysilicon or the like having a large sheet resistance value similarly to the fourth resistor element R4. For example, the fourth resistor element R4 is formed of the same material at the same layer as the scanning line 3a. The second wiring line Lc includes a wiring line containing aluminum between the second terminal 102c and the fourth resistor element R4 and between the fourth resistor element R4 and the temperature detection element 11. The second wiring line Lc is electrically coupled to the fourth capacitance element C4 and the other source-drain of the transistor Tr, which are described with reference to FIG. 4. The second wiring line Lc extends across the seal material 107, and is electrically coupled to the cathode 11c of the temperature detection element 11 arranged in a region overlapping with the partition 29.

Here, the first resistor element R1 is arranged in a region overlapping with the second substrate 20, and the third resistor element R3 and the fourth resistor element R4 are arranged in a region not overlapping with the second substrate 20. The fourth resistor element R4 has a resistance value greater than that of the third resistor element R3. Therefore, generally, when the elements are formed at the same wiring layer, the arrangement area of the fourth resistor element R4 is larger than the arrangement area of the third resistor element R3. The third resistor element R3 has a resistance value greater than that of the first resistor element R1. Therefore, generally when the elements are formed at the same wiring line, the arrangement area of the third resistor element R3 is larger than the arrangement area of the first resistor element R1.

Further, the transistor Tr is also arranged in a region not overlapping with the second substrate 20. Note that, with regard to the temperature detection circuit 1, FIG. 5 illustrates the elements other than the first wiring line La, the third resistor element R3, the first resistor element R1, the second wiring line Lc, and the fourth resistor element R4 in a symbolic manner.

1-4. Operations and Effects of First Exemplary Embodiment

As described above, in the electro-optical device 100 according to the present exemplary embodiment, the first resistor element R1 is electrically coupled to the temperature detection element 11 in series. Thus, at the time of entry of a surge current caused by static electricity, the first resistor element divides the voltage. Thus, a voltage applied to the temperature detection element 11 can be reduced. The first resistor element R1 is electrically coupled to the temperature detection element 11 in series. Thus, at the time of entry of a surge current, a current toward the temperature detection element 11 can be reduced. Therefore, protection of the temperature detection element 11 can be reinforced.

Attenuation of a surge current can also be achieved by further increasing the resistance values of the third resistor element R3 and the fourth resistor element R4 without using the first resistor element R1. In this case, the arrangement areas of the third resistor element R3 and the fourth resistor element R4 are increased. As a result, it is required to provide the transistor Tr near the display region 10a, and there is no choice but to arrange the transistor Tr so as to overlap with the second substrate 20. In this case, a temperature of the display region 10a is increased by illumination light with which the electro-optical device 100 is irradiated. Along with this, a temperature of the transistor Tr is increased, and a leakage current of the transistor Tr is increased. As a result, at the time of temperature detection, a part of the driving current IF to be supplied to the temperature detection element 11 flows between the source and the drain of the transistor Tr. Thus, the temperature detection element 11 cannot be driven with a predetermined constant current. Moreover, when the transistor Tr is arranged so as to overlap with the second substrate 20, the transistor Tr is covered with a quartz substrate having low heat conductivity. Thus, it is difficult to cool the transistor Tr. Therefore, a detection accuracy for a temperature is degraded particularly in a case of a high temperature.

Meanwhile, in the present exemplary embodiment, the first resistor element R1 is additionally provided independently from the third resistor element R3 and the fourth resistor element R4, and there is no need to increase a size of the third resistor element R3 and the fourth resistor element R4. Thus, the transistor Tr can be provided at a position sufficiently away from the display region 10a. The transistor Tr can be prevented from overlapping with the second substrate 20. Therefore, an increase of a leakage current of the transistor Tr, which is caused along with a temperature increase, can be suppressed.

In the present exemplary embodiment, the resistance value of the first resistor element R1 is smaller than the resistance value of the third resistor element R3, and the first resistor element R1 is arranged so as to overlap with the second substrate 20. Further, the resistance value of the fourth resistor element R4 is greater than the third resistor element R3, and the third resistor element R3 and the fourth resistor element R4 are arranged so as not to overlap with the second substrate 20.

The resistance value of the first resistor element R1 is smaller than the resistance value of the third resistor element R3, and hence the arrangement area can be reduced. Even immediately after entry of a surge current, a surge current flowing through the first resistor element R1 is small, and hence increase in temperature is less likely to occur. Therefore, an influence on the voltage VF by the resistance value fluctuations of the first resistor element R1, which are caused along with increase in temperature, is negligible, and hence the first resistor element R1 can be arranged so as to overlap with the second substrate 20. As a result, arrangement of the electro-static protection circuit 12 in the first substrate 10 is facilitated.

The resistance value of the fourth resistor element R4 is greater than the resistance value of the third resistor element R3. Thus, when a surge current enters from the second terminal 102c, a maximum voltage applied to the transistor Tr or the temperature detection element 11 is suppressed. When a surge current enters from the first terminal 102a, entering charges are released to the second terminal 102c via the transistor Tr and the temperature detection element 11. In contrast, when a surge current enters from the second terminal 102c, entering charges are released to the first terminal 102a via the transistor Tr. Therefore, when the resistance value of the fourth resistor element R4 and the resistance value of the third resistor element R3 are set to be equal to each other, a maximum applied voltage of the transistor Tr or the temperature detection element 11 at the time of entry of a surge current from the second terminal 102c tends to be relatively high. As a result, capacity to resist pressure at the time of entry of a surge current from the second terminal 102c tends to be relatively low. Meanwhile, by setting the resistance value of the fourth resistor element R4 to be greater than the resistance value of the third resistor element R3, a maximum voltage applied to the transistor Tr or the temperature detection element 11 is suppressed when a surge current enters from the second terminal 102c. As a result, capacity to resist pressure generated when a surge current enters from the second terminal 102c is improved.

The third resistor element R3, the fourth resistor element R4, and the transistor Tr are arranged so as not to overlap with the second substrate 20. Thus, even immediately after entry of a surge current, cooling is facilitated. At the time of entry of a surge current, the third resistor element R3, the fourth resistor element R4, and the transistor Tr function as paths for almost all the entering charges. The resistance values of the third resistor element R3 and the fourth resistor element R4 are relatively large, and hence temperatures thereof are easily increased. Thus, an influence on the voltage VF by the resistance value fluctuations is not negligible in some cases. When a leakage current of the transistor Tr is increased due to increase in temperature, an influence thereof on the voltage VF is also not negligible in some cases. Meanwhile, when the third resistor element R3, the fourth resistor element R4, and the transistor Tr are arranged so as not to overlap with the second substrate 20, the third resistor element R3, the fourth resistor element R4, and the transistor Tr are not covered with a quartz substrate having low heat conductivity, and can be cooled by air. Thus, cooling is facilitated.

Note that, in order to reduce a voltage applied to each of the diodes D of the temperature detection element 11 at the time of entry of a surge current, the number of the diodes D coupled in series may be increased as a solution. However, when the number of the diodes D coupled in series is increased, an operation point voltage of the temperature detection element 11 is increased. Thus, it is required to increase a drive voltage of the constant current circuit 661. Therefore, there arises a problem of complication and increased cost of the configuration of the upper circuit 60. Meanwhile, according to the present exemplary embodiment, the temperature detection element 11 can be protected without increasing the number of the diodes D coupled in series.

Further, in the present exemplary embodiment, the first capacitance element C1 is provided between the first coupling wiring line 76 and the second coupling wiring line 77 of the wiring substrate 70, and hence protection of the temperature detection circuit 1 can be reinforced. For example, in a case in which only the electro-optical device 100 is used, when a surge current caused by static electricity enters the first coupling wiring line 76 from the second end 702, the temperature detection circuit 1 is effectively protected. Specifically, the first capacitance element C1 having a large capacitance value accumulates entering charges, and hence an excessive voltage is prevented from being applied to the temperature detection circuit 1. The first capacitance element C1 can reinforce protection of the temperature detection circuit 1, and hence the first resistor element R1, the second resistor element R2, the third resistor element R3, the fourth resistor element R4, the third capacitance element C3, the fourth capacitance element C4, and the transistor Tr can be reduced in size.

Here, as the electro-static capacitance of the first capacitance element C1 is greater, a protection function at the time of entry of a surge current is higher. The diodes D being the temperature detection element 11 is driven with a constant current being a current of approximately 0.1 µA to 1 µA. In view of the above-mentioned circumstance, in the present exemplary embodiment, the electro-static capacitance of the first capacitance element C1 is set to 1 µF or lower, for example. Thus, even when the first capacitance element C1 is provided, a trouble is less likely to occur at the time of driving the temperature detection element 11 with a constant current. When the driving current IF for driving the temperature detection element 11 with a constant current is increased, the electro-static capacitance value of the first capacitance element C1 can be increased to improve a protection function at the time of entry of a surge current. However, an operation point voltage of the temperature detection element 11 is increased, and hence it is required to increase a drive voltage of the constant current circuit. Therefore, there arises a problem of complication and increased cost of the configuration of the upper circuit 60. Meanwhile, according to the present exemplary embodiment, the first capacitance element C1 can effectively protect the temperature detection circuit 1 without increasing the driving current IF for driving the temperature detection element 11 with a constant current.

The first capacitance element C1 is provided between the first coupling wiring line 76 and the second coupling wiring line 77, and the electro-static capacitance of the first capacitance element C1 is configured to be greater than the electro-static capacitance of the second capacitance element C2. With this configuration, protection of the temperature detection circuit 1, stabilization of the voltage VF, and followability of the voltage VF to a temperature change can be achieved. In the temperature detection circuit 1, main factors that determine followability of the voltage VF to a temperature change are the driving current IF, the first capacitance element C1, and the second capacitance element C2. Qualitatively, when the driving current IF is increased, and the total of the electro-static capacitances of the first capacitance element C1 and the second capacitance element C2 is reduced, followability is improved. However, as described above, in order to avoid complication and increased cost of the configuration of the upper circuit 60, increase in size of the driving current IF is difficult. Meanwhile, in order to protect the temperature detection circuit 1 and stabilize the voltage VF, the first capacitance element C1 and the second capacitance element C2 require sufficiently large electro-static capacitances.

In view of this, in the first exemplary embodiment, the electro-static capacitance of the first capacitance element C1 is approximately 0.22 µF, and the electro-static capacitance of the second capacitance element C2 is approximately 0.1 µF. The electro-static capacitance of the first capacitance element C1 is greater than the electro-static capacitance of the second capacitance element C2, and hence protection of the temperature detection circuit 1 is effectively reinforced. Simultaneously, the first capacitance element C1 and the second capacitance element C2 stabilize the voltage VF. The total of the electro-static capacitances of the first capacitance element C1 and the second capacitance element C2 is approximately 1 µF or smaller. With this, a useful temperature detection circuit can be achieved. Specifically, when five diodes D are coupled in series to obtain the temperature detection element 11, and a driving current is approximately 0.7 µA, the constant current circuit 661 can be configured as a 5-V power source. Further, when a temperature of the electro-optical panel 100*p* is suddenly changed from a temperature around a room temperature to a temperature at 80 degrees Celsius, the voltage VF follows in three seconds or less. This is sufficient followability with respect to air flow control of a cooling fan or control of a heating mechanism.

Further, on the wiring substrate 70, the distance L1 from the first capacitance element C1 to the first end 701 is shorter than the distance L2 from the first capacitance element C1 to the second end 702. Thus, the potential of the second coupling wiring line 77 being a cathode wiring line can be stabilized in the vicinity of the electro-optical panel 100*p*. The second coupling wiring line 77 corresponding to a cathode wiring line is provided with the wide part 770, and hence a wiring resistance of the second coupling wiring line 77 can be reduced. The wide part 770 is provided on the side of the second end 702 with a longer wiring line length, and hence a wiring resistance of the second coupling wiring line 77 can be effectively reduced. Therefore, the potential of the cathode wiring line on the wiring substrate 70 can be stabilized. Thus, a noise of the first coupling wiring line 76 being an anode wiring line can be suppressed. As a result, the voltage VF is stabilized.

2. Second Exemplary Embodiment

Figure 6:
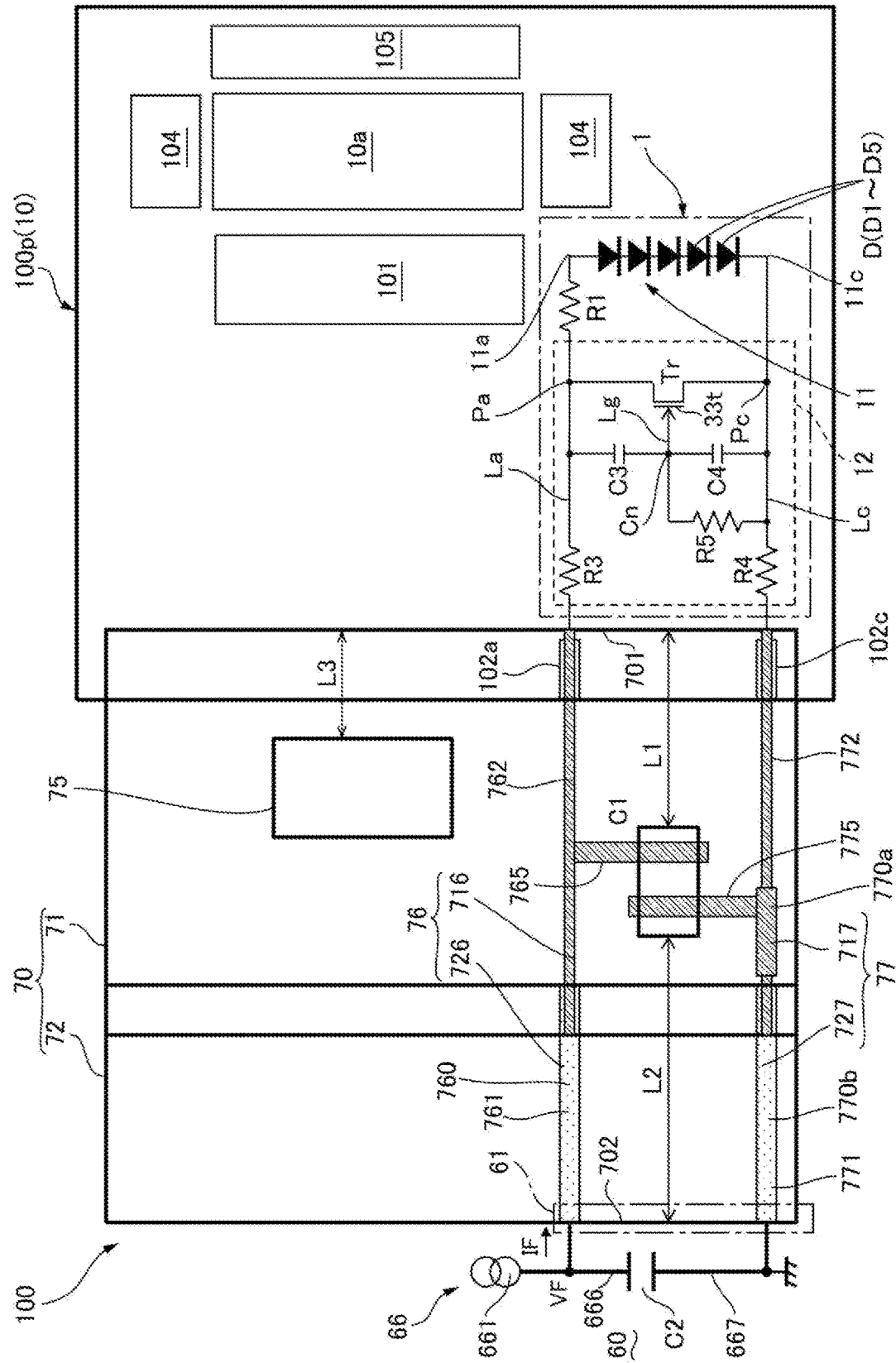
FIG. 6 is an explanatory diagram of an electro-optical device according to a second exemplary embodiment of the present disclosure.

FIG. 6 is an explanatory diagram of the electro-optical device 100 according to a second exemplary embodiment of the present disclosure. Note that basic configurations in the present exemplary embodiment are similar to those in the first exemplary embodiment, and thus, common portions are denoted with identical reference signs and a description therefor is omitted.

In the first exemplary embodiment, the wiring substrate 70 is one substrate. However, in the present exemplary embodiment, as illustrated in FIG. 6, the wiring substrate 70 includes a first wiring substrate 71 coupled to the first substrate 10 and a second wiring substrate 72 that couples the first wiring substrate 71 and the upper circuit 60. The first wiring substrate 71 and the second wiring substrate 72 are electrically coupled to each other. Therefore, the end of the first wiring substrate 71, which is on a side close to the first substrate 10, forms the first end 701 of the wiring substrate 70, and the end of the second wiring substrate 72, which is on a side close to the upper circuit 60, forms the second end 702 of the wiring substrate 70. In the present exemplary embodiment, the first wiring substrate 71 is a Chip on Film (COF) to which the drive circuit element 75 is mounted. Therefore, according to the present exemplary embodiment, the first wiring substrate 71 that is expensive can be shortened, and hence cost reduction can be achieved.

Here, the first coupling wiring line 76 includes a wiring line 716 of the first wiring substrate 71 and a wiring line 726 of the second wiring substrate 72. The second coupling wiring line 77 includes a wiring line 717 of the first wiring substrate 71 and a wiring line 727 of the second wiring substrate 72. Here, the second coupling wiring line 77 includes the first extending portion 771 that extends from the first capacitance element C1 to the second end 702 and is provided with the wide part. Specifically, a part of the first wiring substrate 71, which extends from the second electrode portion 775 to the second wiring substrate 72, is provided with a wide part 770*a*, and the wiring line 727 of the second wiring substrate 72 is provided with a wide part 770*b*. Note that, in FIG. 6, the entire wiring line 727 of the second wiring substrate 72 corresponds to the wide part 770*b*, but the mode is not limited thereto. There may be adopted a mode of partially providing the wide part 770*b*.

Further, in the present exemplary embodiment, in the first coupling wiring line 76, the entire wiring line 726 of the second wiring substrate 72 corresponds to a wide part 760. With this, the first coupling wiring line 76 includes a first extending portion 761 extending from the first capacitance element C1 to the second end 702 and a second extending portion 762 extending from the first capacitance element C1 to the first end 701, and the first extending portion 761 has a wider part than the second extending portion 762.

Note that, in the mode illustrated in FIG. 6, the first wiring substrate 71 is provided with the first capacitance element C1. Alternatively, the second wiring substrate 72 may be provided with the first capacitance element C1.

3. Another Exemplary Embodiment of Electro-Optical Device

In the present disclosure, the electro-optical device 100 is not limited to a liquid crystal device. The present disclosure may be applied to the electro-optical device 100 other than a liquid crystal device, such as an organic electroluminescence device.

4. Configuration Example of Electronic Apparatus

Figure 7:
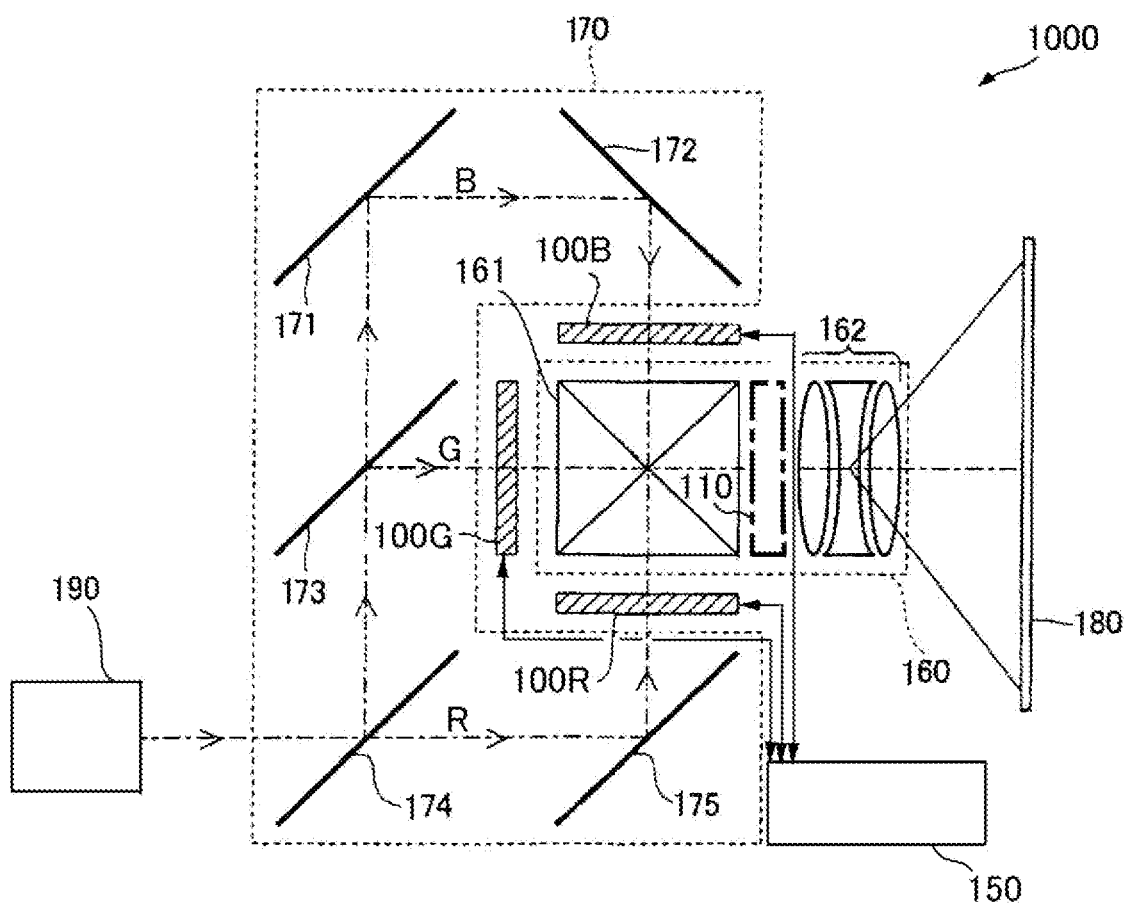
FIG. 7 is a block diagram illustrating a configuration example of a projection-type display apparatus to which the present disclosure is applied.
Figure 8:
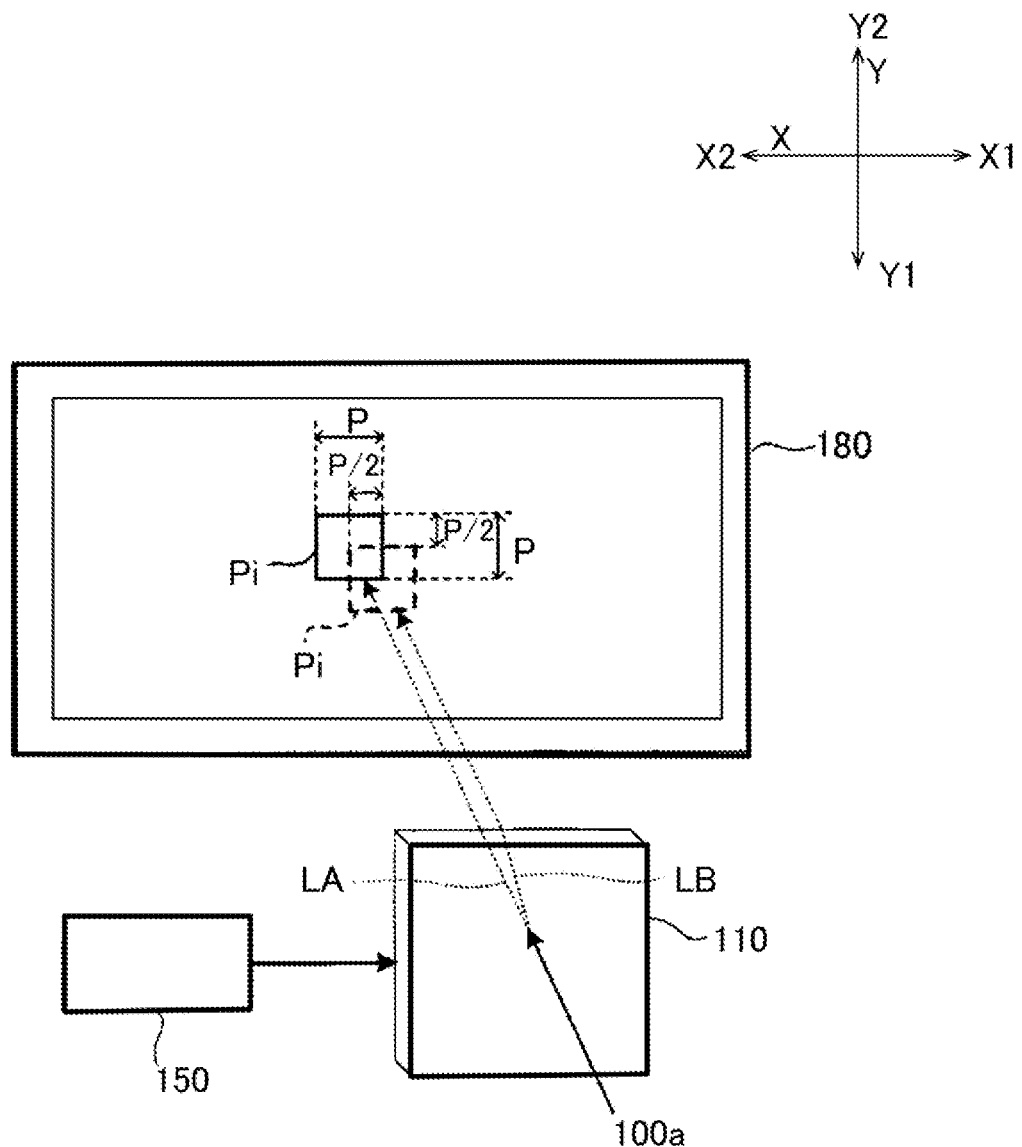
FIG. 8 is an explanatory diagram of an optical path shift element illustrated in FIG. 7.

FIG. 7 is a block diagram illustrating a configuration example of a projection-type display apparatus 1000 to which the present disclosure is applied. FIG. 8 is an explanatory diagram of an optical path shift element 110 illustrated in FIG. 7. Note that, in FIG. 7, the polarization plate and the like are omitted in illustration. The projection-type display apparatus 1000 illustrated in FIG. 7 is one example of an electronic apparatus to which the present disclosure is applied, and includes an illumination device 190, a separation optical system 170, three electro-optical devices 100R, 100G, and 100B, and a projection optical system 160. Each of the electro-optical devices 100R, 100G, and 100B is the electro-optical device 100 described with reference to FIG. 1 to FIG. 6.

The illumination device 190 is a white light source, and a laser light source or a halogen lamp is used, for example. The separation optical system 170 includes three mirrors 171, 172, and 175, and dichroic mirrors 173 and 174. The separation optical system 170 separates white light emitted from the illumination device 190 into the three primary colors including a red color R, a green color G, and a blue color B. Specifically, the dichroic mirror 174 transmits light of the wavelength region of the red color R, and reflects light of the wavelength regions of the green color G and the blue color B. The dichroic mirror 173 transmits light of the wavelength region of the blue color B, and reflects light of the wavelength region of the green color G. The light of the red color R, the light of the green color G, and the light of the blue color B are guided by the electro-optical devices 100R, 100G, and 100B, respectively.

The light modulated by each of the electro-optical devices 100R, 100G, and 100B enters a dichroic prism 161 from three directions. The dichroic prism 161 forms a synthesis optical system in which an image of the red color R, an image of the green color G, and an image of the blue color B are synthesized. Therefore, a projection lens system 162 projects a synthesized image, which is emitted from the optical path shift element 110, onto a projected member such as a screen 180 in an enlarged manner, thereby displaying a color image on the projected member such as the screen 180.

In this case, a control unit 150 is capable of correcting an image signal to be supplied to the electro-optical devices 100R, 100G, and 100B, based on a temperature detection result obtained by the temperature detection circuit 1. Thus, even when an environment temperature or the like fluctuates, a projection image with high quality can be displayed. The optical path shift element 110 denoted with the one-dot chain line is provided to the projection optical system 160 on the side to which the dichroic prism 161 emits light, and a resolution is increased by a technique of shifting a position at which a projection pixel is visually recognized, every predetermined period. When such a configuration is adopted, it is required to drive a liquid crystal layer at a high speed. Even in this case, the electro-optical layer 50 including a liquid crystal layer can be driven at a high speed by adopting a configuration of correcting an image signal to be supplied to the electro-optical devices 100R, 100G, and 100B or adjusting a temperature of the electro-optical panel 100p of the electro-optical devices 100R, 100G, and 100B, based on the temperature detection result obtained by the temperature detection circuit 1.

As illustrated in FIG. 8, the optical path shift element 110 is an optical element that shifts light, which is emitted from the dichroic prism 161, in a predetermined direction. FIG. 8 illustrates a state in which a position of a projection pixel Pi, at which light emitted from each of the pixels 100a of the electro-optical panel 100p is visually recognized, is shifted by the optical path shift element 110 by a distance corresponding to 0.5 pixel pitch (=P/2) to one side X1 in the X direction and a 0.5 pixel pitch (=P/2) to one side Y1 in the Y direction. The optical path shift element 110 includes a light-transmissive plate, and an actuator swings the light-transmissive plate about one of the axial line extending in the first direction X and the axial line extending in the second direction Y, or about both the directions, under a command from the control unit 150. With this, an optical path of the light emitted from each of the pixels 100a of the electro-optical panel 100p can be shifted between an optical path LA and an optical path LB.

5. Other Exemplary Embodiments of Electronic Apparatus

A projection-type display apparatus may be configured to use, as a light source unit, an LED light source configured to emit light in various colors, and the like to supply light in various colors emitted from the LED light source to another liquid crystal apparatus.

The electronic apparatus including the electro-optical device 100 to which the present disclosure is applied is not limited to the projection-type display apparatus 1000 of the above-described exemplary embodiment. Examples of the electronic apparatus may include a projection-type head up display (HUD), a direct-view-type head mounted display (HMD), a personal computer, a digital still camera, and a liquid crystal television.

What is claimed is:

1. An electro-optical device comprising:
  a temperature detection element;
  a first resistor element electrically coupled to the temperature detection element in series; and
  an electro-static protection circuit including a transistor electrically coupled to the first resistor element and the temperature detection element in parallel.

2. The electro-optical device according to claim 1, comprising:
  a first terminal;
  a first wiring line configured to electrically couple the transistor and the first resistor element to the first terminal;
  a second terminal; and
  a second wiring line configured to electrically couple the transistor and the temperature detection element to the second terminal.

3. The electro-optical device according to claim 2, comprising
  a second resistor element electrically coupled to an electrode, of the temperature detection element, on an opposite side from an electrode electrically coupled to the first resistor element, wherein
  the electro-static protection circuit is electrically coupled to the first resistor element, the temperature detection element, and the second resistor element in parallel.

4. The electro-optical device according to claim 2, wherein
  the electro-static protection circuit includes a third resistor element, and
  a resistance value of the third resistor element is greater than a resistance value of the first resistor element.

5. The electro-optical device according to claim 3, wherein
  the electro-static protection circuit includes a fourth resistor element, and
  a resistance value of the fourth resistor element is greater than a resistance value of the second resistor element.

6. The electro-optical device according to claim 2, wherein
  the temperature detection element and the electro-static protection circuit are provided outside a display region.

7. The electro-optical device according to claim 6, comprising
  a wiring substrate electrically coupled to the first terminal and the second terminal, wherein the wiring substrate includes a first coupling wiring line and a second coupling wiring line, the first coupling wiring line being electrically coupled to the first wiring line via the first terminal, the second coupling wiring line being electrically coupled to the second wiring line via the second terminal.

8. The electro-optical device according to claim 7, comprising
a first capacitance element having one electrode electrically coupled to the first wiring line and another electrode electrically coupled to the second wiring line.

9. The electro-optical device according to claim 8, wherein
on the wiring substrate, the first capacitance element has the one electrode electrically coupled to the first coupling wiring line, and the other electrode electrically coupled to the second coupling wiring line.

10. The electro-optical device according to claim 9, wherein
the wiring substrate has a first end coupled to an electro-optical panel, and a second end on an opposite side from the first end, and
a distance from the first capacitance element to the first end is shorter than a distance from the first capacitance element to the second end.

11. The electro-optical device according to claim 10, wherein
the wiring substrate is provided with a drive circuit element configured to output an image signal to the electro-optical panel, and
a distance from the drive circuit element to the first end is shorter than the distance from the first capacitance element to the first end.

12. The electro-optical device according to claim 10, wherein
the first coupling wiring line includes a first extending portion and a second extending portion, the first extending portion extending from the first capacitance element to the second end, the second extending portion extending from the first capacitance element to the first end, and
the first extending portion has a wider part than the second extending portion.

13. The electro-optical device according to claim 10, wherein
the wiring substrate includes a first wiring substrate and a second wiring substrate, the first wiring substrate having the first end, the second wiring substrate being electrically coupled to the first wiring substrate and having the second end.

14. The electro-optical device according to claim 10, comprising
a temperature detection drive circuit configured to supply a constant current to the temperature detection element via the first coupling wiring line and the second coupling wiring line, and configured to detect a voltage of the first coupling wiring line and the second coupling wiring line when the constant current is supplied, wherein
the temperature detection drive circuit includes a second capacitance element between a wiring line electrically coupled to the first coupling wiring line and a wiring line electrically coupled to the second coupling wiring line, and
an electro-static capacitance of the second capacitance element is smaller than an electro-static capacitance of the first capacitance element.

15. An electronic apparatus comprising
the electro-optical device according to claim 1.

* * * * *